United States Patent [19]
Wördenweber et al.

[11] Patent Number: 6,110,336
[45] Date of Patent: Aug. 29, 2000

[54] HIGH PRESSURE MAGNETRON CATHODE ASSEMBLY AND SPUTTERING APPARATUS UTILIZING SAME

[75] Inventors: Roger Wördenweber, Niederzier, Germany; Georg Ockenfuss, Santa Rosa, Calif.; Jens Schneider; Wilfried Klein, both of Jülich, Germany

[73] Assignee: Forschunszentrum Julich GmbH, Julich, Germany

[21] Appl. No.: 09/131,488

[22] Filed: Aug. 10, 1998

[30] Foreign Application Priority Data

Aug. 11, 1997 [DE] Germany .................. 197 34 633

[51] Int. Cl.[7] ............................................ C23C 14/34
[52] U.S. Cl. .................. 204/298.11; 204/298.07; 204/298.09; 204/298.12; 204/298.19; 204/192.24; 204/298.14; 204/298.06; 204/298.13
[58] Field of Search .............. 204/298.07, 298.09, 204/298.11, 298.12, 298.19, 298.2, 192.2, 192.24, 298.14, 298.06, 298.13

[56] References Cited

U.S. PATENT DOCUMENTS

| | | | |
|---|---|---|---|
| 3,361,659 | 1/1968 | Bertelsen | 204/192.12 |
| 4,508,612 | 4/1985 | Blackwell et al. | 204/298.11 |
| 4,776,938 | 10/1988 | Abe et al. | 204/192.2 |
| 4,933,063 | 6/1990 | Katsura et al. | 204/298.09 |
| 5,328,585 | 7/1994 | Stevenson et al. | 204/298.19 |
| 5,427,665 | 6/1995 | Hartig et al. | 204/192.12 |
| 5,514,259 | 5/1996 | Shiota et al. | 204/298.19 |
| 5,667,650 | 9/1997 | Face et al. | 204/298.07 |

*Primary Examiner*—Rodney McDonald
*Attorney, Agent, or Firm*—Herbert Dubno

[57] ABSTRACT

A magnetron cathode and sputtering system in which the cathode assembly includes a diaphragm arrangement with one or more diaphragms which overlie at least the edge of the cathode at the dark side region of the gas discharge so that plasmas cannot form between the diaphragm and target. An improved sputtering is thereby obtained in a high pressure mode of operation.

11 Claims, 3 Drawing Sheets

HIGH PRESSURE MAGNETRON CATHODE ASSEMBLY AND SPUTTERING APPARATUS UTILIZING SAME

FIELD OF THE INVENTION

Our present invention relates to the field of sputtering and, more particularly, to a high pressure magnetron cathode assembly. The invention also relates to a sputtering apparatus utilizing the improved cathode assembly.

BACKGROUND OF THE INVENTION

The state of the art recognizes processes for depositing materials composed of individual elements (metals or the like), alloys, reaction products of one or more elements and other materials including oxides, and reaction products with nitrogen by sputtering techniques utilizing single-component or multi-component targets with the target being connected cathodically. Such processes are known as cathodic sputtering or deposition and generally the substrate to be coated is connected as the anode relative to the more negative cathode or target. Such processes may involve supporting magnetic fields, in which case the cathode and target can form a magnetron, the process then being referred to as magnetron sputtering.

Magnetron sputtering is usually carried out at pressures below a value of $1 \times 10^{-2}$ mBar. At these sputtering pressures it is found that the free path lengths are comparatively large so that the particles which have been atomized form the target, depending upon the target-substrate distance, scarcely interact with one another before they arrive at the substrate. As a result, by contrast with other deposition processes, the energies of these particles can be comparatively high and the process can be used to produce high quality dense coatings which are strongly adherent to the substrate and have comparatively high hardness. In this way, magnetron sputtering can be distinguished from vapor deposition processes in which, because the particles are in the vapor phase, they are at comparatively lower energies.

In recent years efforts have been made to apply such coating methods to thin film technologies and particularly there is a desire or need, especially in the production of complex high temperature superconductors (HTS) or certain oxidic ceramics which may be used for other purposes and other coatings which may have to be applied to sensitive organic carriers, to utilize particle energies which are higher than those which hitherto have been utilized for vapor deposition methods but are lower than the typical energies achieved by sputtering.

In these cases efforts have been made to use sputtering processes which have been modified by so-called thermalization. In these sputtering systems the pressure is raised somewhat so that there is reduction of the free path length of the atomized particle as a result of interparticle collisions which have a braking effect so that the particles arrive with reduced energy at the substrate.

When attempts are made to utilize such thermalization control for the particle energy with conventional magnetron sputtering, it is found that:

(i) increased pressure results in a modification of the plasma. Thus the dark space region at the cathode side is reduced significantly more strongly at the cathode surface. When such assemblies utilize standard diaphragms which are conventionally positioned to prevent ion bombardment in edge regions of the target, there is an undesirable sputtering between the cathode and the diaphragm, i.e. a substantial plasma formation between the cathode or target and the diaphragm. The formation of a plasma between the target or cathode and the diaphragm can give rise to this undesired sputtering. The problem cannot be solved by omitting the diaphragms.

(ii) For most sputtering depositions with which the invention is concerned, an abnormal sputtering range is utilized, as is the case for example in the deposition of HTS material. To achieve sputtering modes which are successful for this purpose, the high pressure range used is associated with very high energies which can give rise to premature breakdowns. In the case of depositing HTS materials this in practice has been found to directly damage the target.

(iii) The high pressure utilized in sputtering does effectively serve to thermalize the particle, i.e. cause interparticle collisions. The higher pressure however alters the sputtering conditions so that the homogeneity of the deposition decreases with pressure increase as does the uniformity of the deposition rate.

OBJECTS OF THE INVENTION

It is therefore the principal object of the present invention to provide a magnetron cathode assembly which obviates these drawbacks, enables high pressure sputtering to be carried out reliably, uniformly and efficiently, and is capable of yielding high quality sputtered products and especially high temperature superconductor films when utilized for thin film sputtering.

Another object of the invention is to provide an improved sputtering apparatus for the purposes described.

It is also an object of the invention to provide an improved high pressure magnetron system as well as an apparatus containing a cathode assembly of that type with which an improved sputtering process in the high pressure range can be achieved.

SUMMARY OF THE INVENTION

We have found that these objects which are attained with a magnetron-cathode assembly, especially for magnetron cathodic sputtering in which the diaphragm or diaphragms can be positioned with respect to the magnetron cathode or target so that no plasma can be formed between the diaphragm and the target in the regions of the target overlain or covered or shielded by the diaphragm.

More particularly, in one aspect of the invention a magnetron-cathode assembly for generating a plasma can comprise:

a magnetron cathode formed with a target having a dark space region on one side thereof at which a plasma is generated for sputtering of material from the target; and at least one diaphragm overlying the target on the side in the dark space region along an edge of the target and spaced from the target by a distance excluding formation and maintenance of plasma between the diaphragm and the target.

The apparatus for thin film production by magnetron sputtering can comprise:

a magnetron cathode formed with a target having a dark space region on one side thereof at which a plasma is generated for sputtering of material from the target; and at least one diaphragm overlying a part of the target on the side in the dark space region and so positioned that the plasma is generated exclusively from an area of the side of the target not covered by the diaphragm.

The apparatus for thin film production by magnetron sputtering can comprise:

an evacuated housing forming a sputtering chamber;
means for supporting a substrate in the chamber; and
a magnetron cathode assembly for generation of a plasma in the housing, the assembly comprising:
a magnetron cathode formed with a target having a dark space region on one side thereof at which a plasma is generated for sputtering of material from the target onto the substrate, and
at least one diaphragm overlying the target on the side in the dark space region along an edge of the target and spaced from the target by a distance excluding formation and maintenance of plasma between the diaphragm and the target and whereby sputtering of material from the target is effected only over an area of the target not covered by the diaphragm.

The apparatus is used for high pressure magnetron sputtering which, for the purpose of the present invention, is sputtering carried out with a pressure in the sputtering chamber in excess of $1 \times 10^{-2}$ mBar.

An important difference as compared with prior magnetron sputtering systems is, of course, the exclusion of the plasma from between the diaphragm and the target at least at the edge regions at which the diaphragm overlies the target. By limiting the cathodic atomization exclusively to the region of the target which is not covered by the diaphragm, moreover, the invention can give rise to a kind of "off axis" sputtering deposition which has been found to be especially effective in high pressure sputtering with reduced particle energy at the substrate. Indeed, where the diaphragm or radiation shield is provided so that the exposed region of the target is an annulus, the diameter of the substrate can be smaller than the shielded center of that annulus so that the free paths from the annulus toward the substrate are inclined to the common axis of the substrate and the annulus.

While the invention eliminates any plasma intervening between the diaphragm and the target, it enables a sufficient voltage between the substrate and the target portion not shielded by the diaphragm so that the plasma can be formed for effective atomization of the target material only in the regions not shielded by the diaphragm for deposit upon the substrate. The distance between the target and the diaphragm for this result is pressure-dependent. For example, with a sputtering pressure of 0.4 mBar, this distance may be between 0.8 mm and 1 mm.

Alternatively or in addition, the cathode of the invention can be provided with two or more separate diaphragms. In that case, a first diaphragm can be provided which overlies only the edge regions of the target and leaves the center of the target, within the magnetron tracks, unshielded. The center of the target can, however, be shielded if desired to create a quasi-off-axis sputtering mode with the substrate dimensions being usually less than the magnetron track diameter.

A further outer diaphragm can be provided to avoid impurities in the deposit and for generating sufficient voltage with reduced power.

The inner radius of the free track, (for example in the range of 1.5 to 4 cm) is preferably smaller than the radius of the substrate (quasi-off-axis). The width of the open region is sufficient for the current-voltage characteristic to be produced and thus the transition between normal and abnormal sputtering operations.

The diaphragm (especially the central diaphragm) when used for deposits upon heated substrates (for example for high temperature superconductors at temperature ranges above 600° C.) can be formed with additional radiation shields. These can reduce the radiation effect on the target and by thermally decoupling the diaphragm from the heater, can allow the heater to operate at higher temperatures.

The result is improved temperature homogeneity at the substrate, reduction in the energy requirements for the heater, longer heater life and protection of the target.

According to a feature of the invention, means can be provided for flushing the magnetron/target/diaphragm assembly with a flushing gas for the direct and rapid control of the reactive process to the extent to which the deposition is to be effected of a reaction product, for example, a nitride or an oxide. The gas flushing nozzles can be integrated in the diaphragm system. All or part of the process gas can be introduced by this flushing unit directly adjacent the target and, where only a portion of the flushing gas is supplied, that portion can be the reactive component of the flushing gas. The integrated flushing system has been found to be effective especially for depositing NbN, TiN, and $YBa_2Cu_3O_7$. In addition to the flushing nozzles provided around the magnetron tracks, means can be provided for feeding the gas through the inner diaphragm for additional flushing purposes. The homogeneity of the gas feed through the flushing gas nozzles can be increased by providing them with baffles.

According to a feature of the invention, which has been found to be especially effective for the production of $YBa_2Cu_3O_7$ films with the apparatus of the invention, is means for selectively energizing the magnetron with direct current (dc), radio frequency energy (rf) a combination of direct current and radio frequency current (dc+rf) or medium frequency (mf).

It has been found to be advantageous, moreover, to provide the system with means for electrically connecting the diaphragm or diaphragms to ground potential, to a floating potential or to a biasing voltage.

Furthermore, as previously noted, the substrate support can be the substrate heater whose output can be thermally decoupled from the target by mounting of radiation shields upon the diaphragm or diaphragms.

The apparatus can additionally be provided with means for carrying out emission spectroscopy upon the plasma or a Langmuir probe or both.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
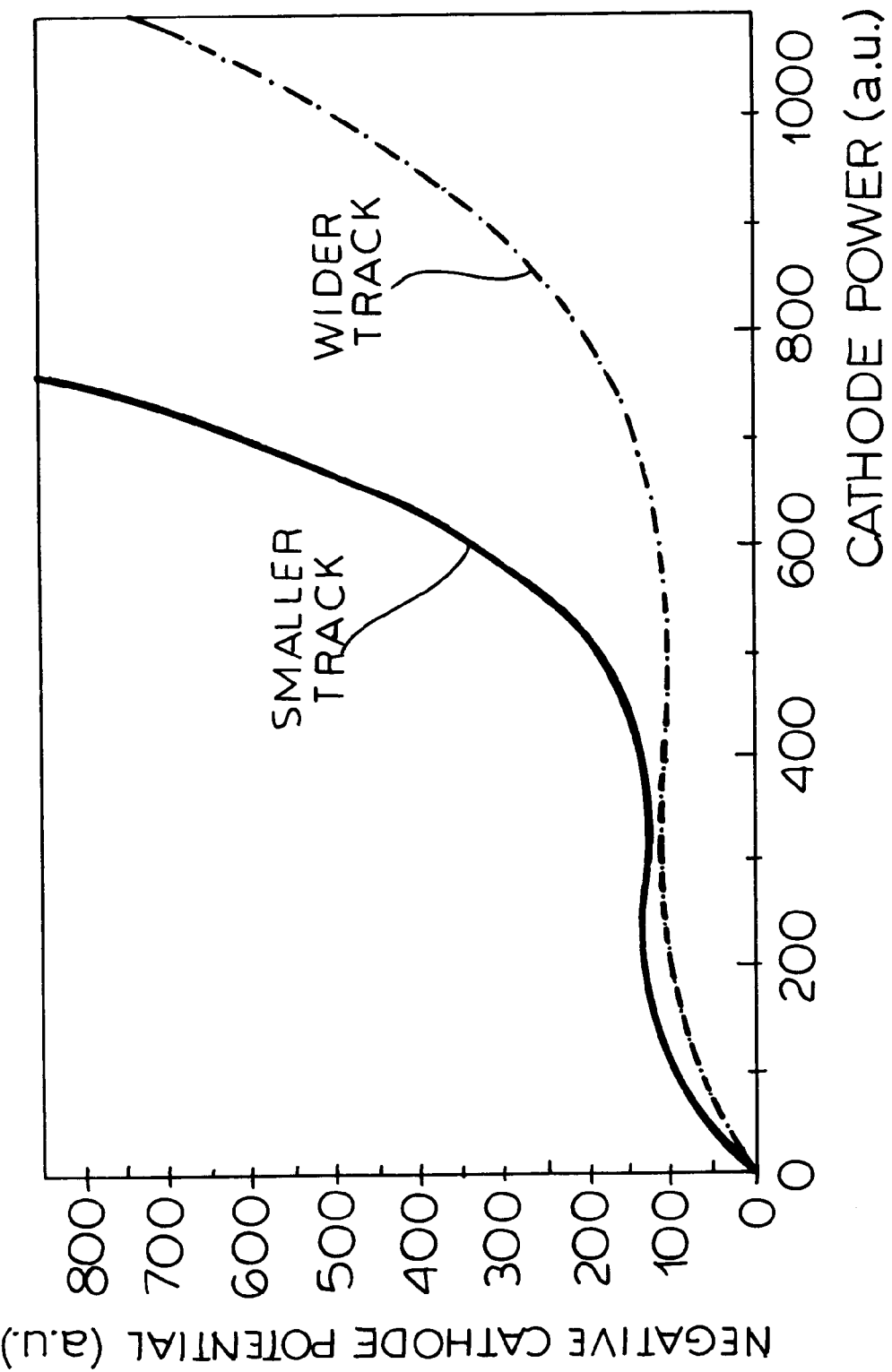
FIG. 1 is a diagram of the transition from a normal sputtering operation to an abnormal sputtering mode for the cathode assembly of the invention.

FIG. 1 has been provided only to show diagrammatically the transition from a normal sputtering range in which an increase in the power supplied to the cathode there is a surface widening of the sputtering range (track), to an abnormal sputtering mode at which the power increase gives rise to an increase in the negative cathode potential and which allows small free track widths to be generated with the high pressure magnetron cathode according to the invention. The dimensioning values depend greatly on the configuration and size of the cathode selected and hence only relative units have been supplied.

Figure 2:
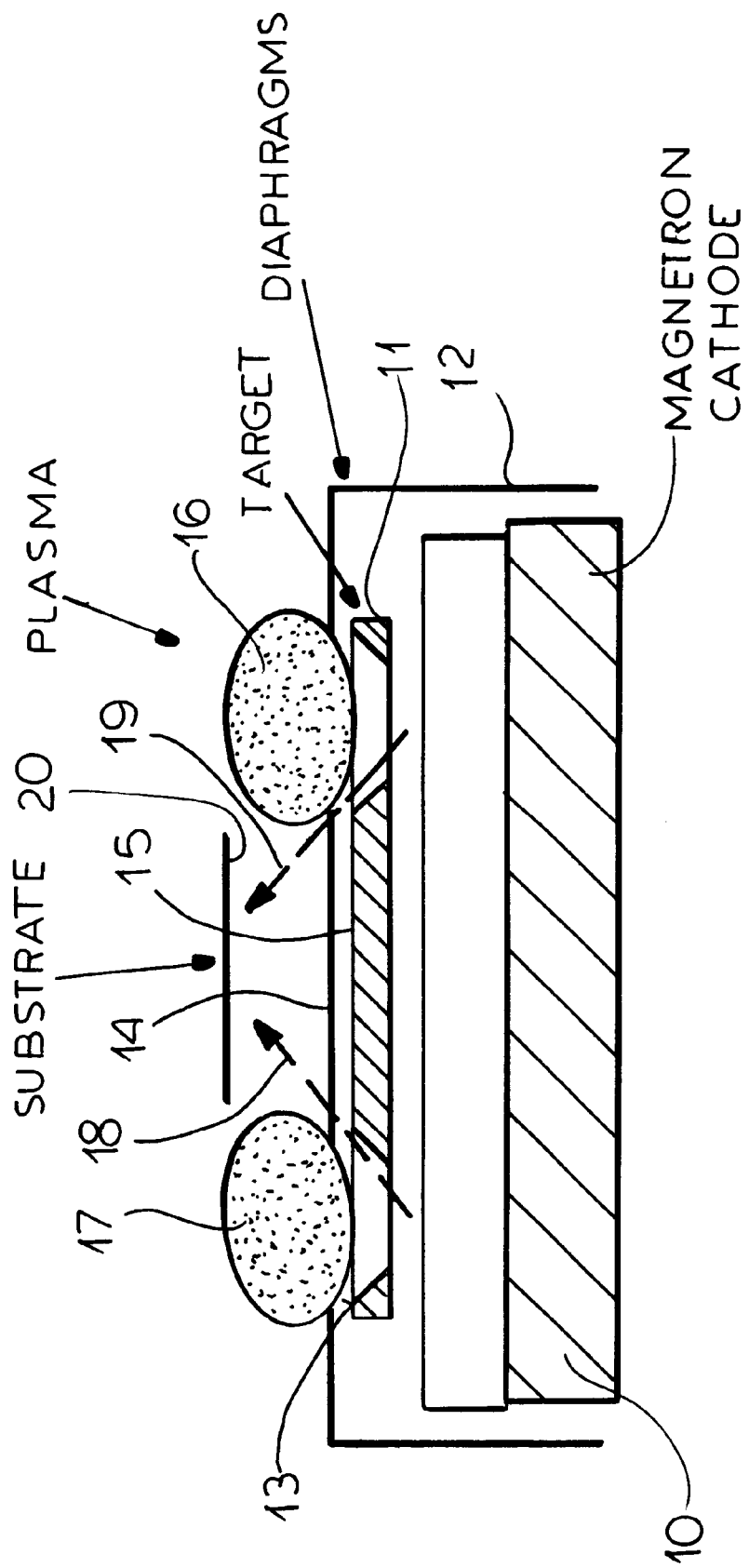
FIG. 2 is a diagrammatic cross sectional view through a magnetron cavity assembly with a diaphragm according to the invention.

FIG. 2 illustrates the principle of quasi-off-axis deposition. In the magnetron target assembly here illustrated the magnetron cathode has been represented diagrammatically at 10 and is adjacent the target 11 which is closely overlain by an outer diaphragm 12 overlying an edge region 13 of the target. A central diaphragm 14 overlies a central portion 15 of the target. The diaphragms 12 and 14 are so spaced from the target 11 that, under the operating pressure which can be say 0.4 mBar, practically no plasma can form. The plasma is confined, as shown at 16 and 17, to the unshielded regions of the target 11 and, as the arrows 18 and 19 symbolize, the deposit direction deviates strongly from the normal to the target surface and to the substrate 20. The openings in the diaphragm system (space between inner and outer diaphragms) are symmetrical above the magnetron track.

In conventional off-axis geometries the substrate lies at about 90° to the target but such an arrangement has the drawback that the deposit may not be homogeneous. With the off-axis deposit approach of FIGS. 2 and 3, this drawback is eliminated.

Figure 3:
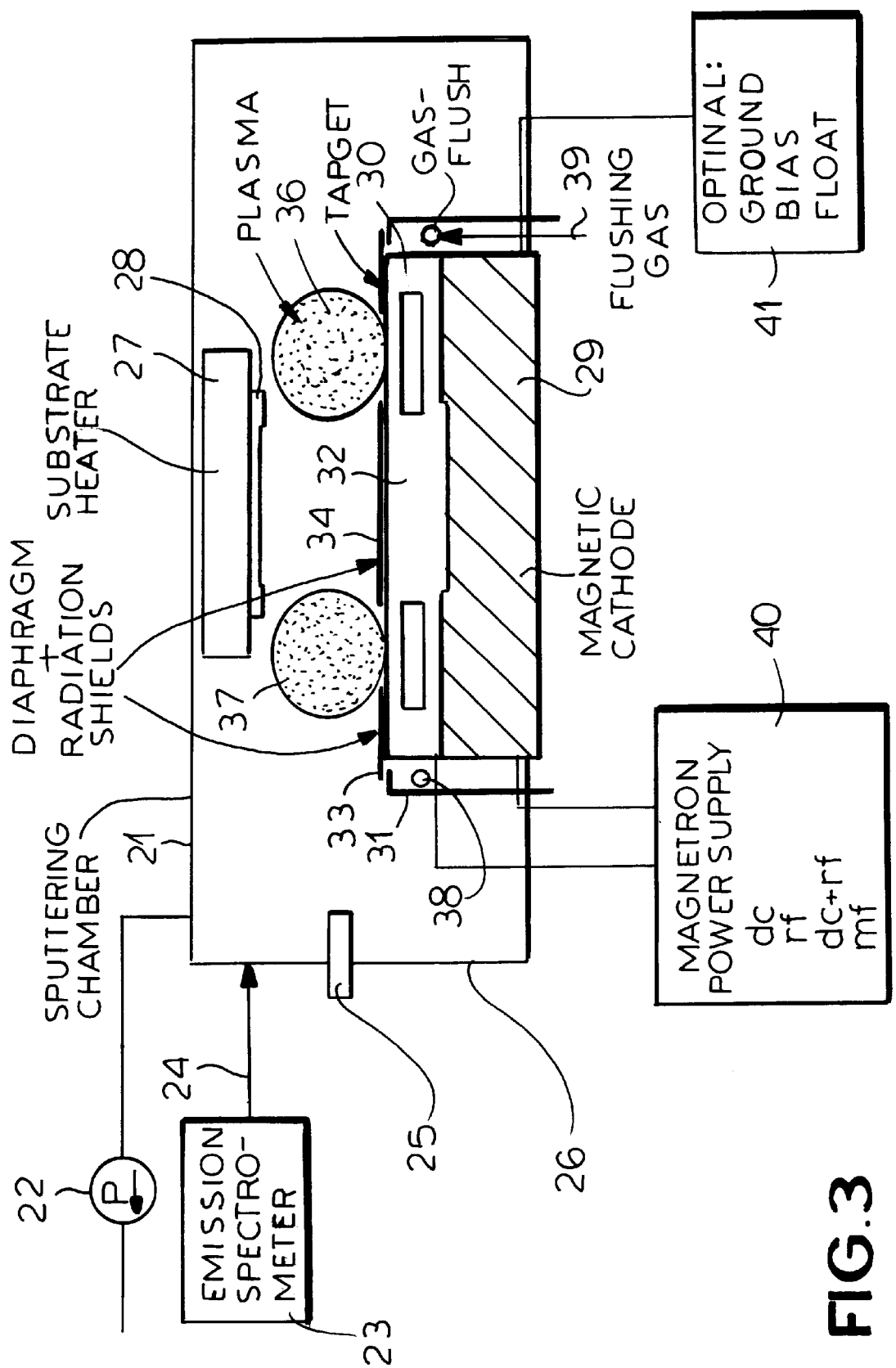
FIG. 3 is a cross sectional view through the apparatus utilizing that magnetron cathode arrangement.

In FIG. 3, the housing of the sputtering chamber is represented at 21 and its interior 20 can be evacuated to the desired pressure by a vacuum source 22. An emission spectrometer 23 can be connected at 24 to the chamber and, if desired, a Langmuir probe 25 can be provided.

The housing 21 carries the substrate heater 27 on which the substrate 28 is mounted. On the housing 21, moreover, the magnetron cathode 29 can be mounted with the target 30 which can be provided with the diaphragm 31 corresponding to the diaphragm 12 previously described and a central diaphragm 32 corresponding to the diaphragm 14. Radiation shields 33 and 34 can overlie these diaphragms. The plasma clouds are shown at 36 and 37 and, integrated into the diaphragm 12, is a set of flushing nozzles 38 supplied with the flushing gas at 39. The flushing gas can be nitrogen where a nitride is to be reactively formed or oxygen in the case of formation of the 1,2,3 superconductor $YBa_2Cu_3O_7$.

The magnetron power supply 40 may be provided to selectively supply dc, rf, dc+rf or mf and an optional additional electrical connection be provided at 41 to the diaphragm which can ground the diaphragm, allow the diaphragm to electrically float with respect to ground and the cathode potential, or provided in appropriate electrical bias. The substrate may be connected to an anode of the deposition system as is conventional.

Thus FIG. 3 shows an embodiment of the apparatus wherein the inner and outer diaphragms have radiation shields and a quasi-off-axis configuration is provided with a parallel arrangement of the target and substrate surfaces, reduction of the free track with limited regions for formation of the plasma and integrated gas flushing. As is standard with such magnetrons, the magnetron track can be ring-shaped in case of a round planar target configuration. However in the illustrated embodiments a race-track shape can be used.

We claim:

1. A cathodic sputtering apparatus comprising:
    a magnetron cathode formed with a target having a dark space region on one side thereof at which a plasma is generated for sputtering of material from said target;
    a substrate spaced from and parallel to said target; and
    at least one diaphragm overlying said target on said side in said dark space region along an edge of the target and spaced from said target by a distance excluding formation and maintenance of plasma between said diaphragm and said target, said at least one diaphragm having a portion interposed between said substrate and the target over the entire area of said substrate and confining said plasma to an outer periphery of said portion outwardly of said substrate.

2. A cathodic sputtering apparatus comprising:
    a magnetron cathode formed with a target having a dark space region on one side thereof at which a plasma is generated for sputtering of material from said target;
    a substrate spaced from and parallel to said target; and
    at least one diaphragm overlying a part of said target on said side in said dark space region and so positioned that said plasma is generated exclusively from an area of said side of said target not covered by said diaphragm, said at least one diaphragm having a portion interposed between said substrate and the target over the entire area of said substrate and confining said plasma to an outer periphery of said portion outwardly of said substrate.

3. The apparatus defined in claim 1 or claim 2, further comprising means for electrically connecting said diaphragm selectively to electrically ground it, cause it to float electrically or to apply a bias thereto.

4. The apparatus defined in claim 1 or claim 2 wherein said diaphragm has a ring-shaped area outwardly of said substrate and through which said target is free to generate said plasma.

5. The apparatus defined in claim 1 or claim 2 wherein said target is formed from a superconductor material.

6. The apparatus defined in claim 1 or claim 2, further comprising at least one device for flooding said assembly with gas integrated in a unit forming said diaphragm.

7. A sputtering apparatus comprising:
    an evacuated housing forming a sputtering chamber;
    means for supporting a substrate in said chamber; and
    a magnetron cathode assembly for generation of a plasma in said housing, said assembly comprising:
        a magnetron cathode formed with a target having a dark space region on one side thereof at which a plasma is generated for sputtering of material from said target onto said substrate, and
        at least one diaphragm overlying said target on said side in said dark space region along an edge of the target and spaced from said target by a distance excluding formation and maintenance of plasma between said diaphragm and said target and whereby sputtering of material from said target is effected only over an area of said target not covered by said diaphragm, said at least one diaphragm having a portion interposed between said substrate and the target over the entire area of said substrate and confining said plasma to an outer periphery of said portion outwardly of said substrate.

8. The apparatus defined in claim 7, further comprising means for electrically connecting said diaphragm selectively to electrically ground it, cause it to float electrically or to apply a bias thereto.

9. The apparatus defined in claim 7 wherein said diaphragm overlies a central region of said target in addition to a peripheral edge thereof to leave a ring-shaped area free to generate said plasma.

10. The apparatus defined in claim 7 wherein said target is formed from a superconductor material.

11. The apparatus defined in claim 7, further comprising at least one device for flooding said assembly with gas integrated in a unit forming said diaphragm.

* * * * *